(12) United States Patent
Sugita et al.

(10) Patent No.: US 6,560,157 B2
(45) Date of Patent: May 6, 2003

(54) SEMICONDUCTOR DEVICE

(75) Inventors: Mitsuru Sugita, Tokyo (JP); Hiroyuki Hashimoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 46 days.

(21) Appl. No.: 09/860,429

(22) Filed: May 21, 2001

(65) Prior Publication Data

US 2002/0071330 A1 Jun. 13, 2002

(30) Foreign Application Priority Data

Dec. 8, 2000 (JP) ...................................... 2000-373966

(51) Int. Cl.[7] .............................................. G11C 7/00
(52) U.S. Cl. ...................................... 365/226; 365/227
(58) Field of Search ................................ 365/226, 227, 365/228, 229

(56) References Cited

U.S. PATENT DOCUMENTS

| | | | | |
|---|---|---|---|---|
| 4,683,382 | A | * 7/1987 | Sakurai et al. | 365/227 |
| 5,612,920 | A | * 3/1997 | Tomishima | 365/226 |
| 5,898,235 | A | * 4/1999 | McClure | 307/64 |
| 6,426,908 | B1 | * 7/2002 | Hikada | 365/226 |

FOREIGN PATENT DOCUMENTS

| | | |
|---|---|---|
| JP | A 11-119844 | 4/1999 |
| JP | A 11 213667 | 8/1999 |

* cited by examiner

*Primary Examiner*—Vu A. Le
(74) *Attorney, Agent, or Firm*—Burns, Doane, Swecker & Mathis, LLP

(57) ABSTRACT

A semiconductor device of one chip has a first power supply terminal allowing connection with an external power supply IC, a second power supply terminal allowing connection with the external power supply IC, a main voltage dropping circuit connected with the first power supply terminal, a secondary voltage dropping circuit connected with the second power supply terminal, and an internal circuit connected with the main voltage dropping circuit and the secondary voltage dropping circuit. A high voltage of the external power supply IC is received in the main voltage dropping circuit through the first power supply terminal and is dropped. The high or low voltage of the external power supply IC is received in the secondary voltage dropping circuit through the second power supply terminal and is dropped. The internal circuit is operated by using the dropped voltage obtained in the main or secondary voltage dropping circuit.

6 Claims, 6 Drawing Sheets

SEMICONDUCTOR DEVICE

BACKGROUND OF THE INVENTION

1. Field of the Invention

The present invention relates to a semiconductor device in which a voltage dropping circuit is arranged to drop a voltage of electric power supplied from a voltage source and to output a dropped voltage, and more particularly to a semiconductor device which can be easily connected and operated with each of various types of integrated circuits for power supply.

2. Description of Related Art

FIG. 8 is a block diagram showing the configuration of a conventional power supply system. In FIG. 8, referential numeral 101 indicates a chip of conventional semiconductor device for receiving a voltage from a voltage supply source and performing an operation by using electric power of the voltage. 102 indicates a power supply integrated circuit (hereinafter, called a power supply IC) for supplying current of a high voltage to the semiconductor device 101. 103 indicates a power supply terminal which is arranged in the semiconductor device 101 and is connected with a wire which extends from the power supply IC 102. 104 indicates an internal circuit. 105 indicates a main voltage dropping circuit for dropping the high voltage applied to the power supply terminal 103 to a prescribed voltage required to operate the internal circuit 104. 106 indicates a secondary voltage dropping circuit which has the same function as that of the main voltage dropping circuit 105. A current supplying capability and an electric power consumption rate in the secondary voltage dropping circuit 106 are smaller than those in the main voltage dropping circuit 105.

Next, an operation of the conventional power supply system will be described below.

Developments in advanced manufacturing of transistors in large scaled integrated (LSI) circuits have lead to reductions in the operation voltage of each transistor. Therefore this has resulted in difficulties with respect to applying conventional transistors which are operated at a standard operation voltage of 5V. Nowadays, integrated circuits (ICs) such as semiconductor devices are manufactured in consideration of the above-described restriction on the ICs. That is, even though it is required to apply a voltage of 5V to an input/output section of the semiconductor device 101, it is required to operate the internal circuit 104 of the semiconductor device 101 at a low voltage. Therefore, in cases where it is required to apply a voltage of 5V to an input/output section of the semiconductor device 101, one of two methods is adopted to operate the internal circuit 104 of the semiconductor device 101 at a low voltage. In the first method, as shown in FIG. 8, dropping circuits represented by the main voltage dropping circuit 105 and the secondary voltage dropping circuit 106 are arranged in the semiconductor device 101. In this case, the power supply IC 102 of one-voltage supply type can be used for the semiconductor device 101, and a manufacturing cost of the conventional power supply system can be reduced.

In general, in cases where a dropping circuit is arranged in the semiconductor device 101 according to the first method, though a manufacturing cost of the conventional power supply system can be reduced, electric power consumed in the dropping circuit is heightened. For example, in cases where an operation frequency in the internal circuit 104 is reduced to reduce electric power consumed in the internal circuit 104, parts of the internal circuit 104 are operated, and the electric power supply for the other parts of the internal circuit 104 is stopped by disconnecting the other parts of the internal circuit 104 from a power supply IC. In this case, electric power consumed in the dropping circuit is larger than that consumed in the internal circuit 104. Therefore, as shown in FIG. 8, the main voltage dropping circuit 105 and the secondary voltage dropping circuit 106 are arranged in the semiconductor device 101. The main voltage dropping circuit 105 is characterized by a high response speed for voltage change, a large current supplying capability and a large electric power consumption rate. The secondary voltage dropping circuit 106 is characterized by a low response speed for voltage change, a small current supplying capability and a small electric power consumption rate. One of these voltage dropping circuits 105 and 106 is appropriately operated.

For example, in cases where low electric power consumption is required of the semiconductor device 101, an output section of the secondary voltage dropping circuit 106 is used as a voltage supply for the internal circuit 104 to reduce electric power consumed in the main voltage dropping circuit 105. In addition, in cases where the voltage applied to the secondary voltage dropping circuit 106 by the power supply IC 102 is lowered, electric power consumed in secondary voltage dropping circuit 106 can be more reduced.

In contrast, the second method is generally adopted for an IC having no dropping circuit, and a power supply IC of two-voltage supply type is used in the second method. In this two-voltage supply type power supply IC, a voltage source of a high voltage such as 5V and a voltage source of a low voltage such as 3.3V are arranged. Electric power of the high voltage of 5V is supplied for an input/output section of a semiconductor device, and electric power of the low voltage of 3.3V is for an internal circuit of a semiconductor device. To set the two-voltage supply type power supply IC in a semiconductor device, the two-voltage supply type power supply IC has a high voltage outputting section and a low voltage outputting section. Electric power of the high voltage is supplied from the high voltage outputting section to the input/output section of the semiconductor circuit, and electric power of the low voltage is supplied from the low voltage outputting section to the internal circuit. In this case, electric power consumed in the internal circuit connected with the low voltage outputting section is larger than that consumed in the input/output section connected with the high voltage outputting section. Therefore, a voltage dropping function is added to the low voltage outputting section to obtain a low electric power consumption rate. In contrast, even though the high voltage is dropped in the high voltage outputting section, the reduction of electric power consumption rate in the input/output section is low. Therefore, no voltage dropping function is usually added to the high voltage outputting section.

Because the conventional semiconductor device has the above-described configuration, in cases where the conventional semiconductor device 101 shown in FIG. 8 is connected with the two-voltage supply type power supply IC according to the second method, it is required to select either a connection of the high voltage outputting section (5V) of the power supply IC with the power supply terminal 103 of the semiconductor device 101 or a connection of the low voltage outputting section (3.3V) of the power supply IC with the power supply terminal 103 of the semiconductor device 101. Therefore, it is required to arrange a switch as a selecting means in the outside of the semiconductor device 101, and there is a problem that this results in increases in manufacturing costs for a power supply system composed of a (What is "e"?) two-voltage supply type power supply IC and the semiconductor device 101. Also, in cases where the conventional semiconductor device 101 is connected with the one-voltage supply type power supply IC according to the first method or is connected with the two-voltage supply type power supply IC according to the second method, because electric power is supplied from the power supply IC 102 to the main voltage dropping circuit 105 and the secondary voltage dropping circuit 106, there is a problem that more electric power is consumed in the power supply system.

SUMMARY OF THE INVENTION

A main object of the present invention is to provide, with due consideration to the drawbacks of the conventional semiconductor device, a semiconductor device which can be easily connected to and operated with any type of power supply IC such as a one-voltage supply type or a two-voltage supply type and which is manufactured at low cost. Also, a subordinate object of the present invention is to provide a semiconductor device in which electric power consumed in both a main voltage dropping circuit and a secondary voltage dropping circuit is reduced even though the main voltage dropping circuit and the secondary voltage dropping circuit are arranged.

The main object is achieved by the provision of a semiconductor device comprising an internal circuit arranged on a chip, a main voltage dropping circuit, arranged on the chip, for dropping a first input voltage to a first dropped voltage and outputting the first dropped voltage to the internal circuit, a secondary voltage dropping circuit, arranged on the chip and having a current supplying capability and an electric power consumption rate smaller than those of the main voltage dropping circuit, for dropping the first input voltage or a second input voltage to a second dropped voltage and outputting the second dropped voltage to the internal circuit, a first power supply terminal which is arranged on the chip so as to allow connection with an external voltage source and is connected with the main voltage dropping circuit, and a second power supply terminal which is arranged on the chip so as to allow connection with the external voltage source and is connected with the secondary voltage dropping circuit.

In the above configuration, in cases where the semiconductor device is connected with a one-voltage supply type voltage source, electric power of a first input voltage is supplied from the one-voltage supply type voltage source to the main voltage dropping circuit through the first power supply terminal, electric power of the first input voltage is supplied from the one-voltage supply type voltage source to the secondary voltage dropping circuit through the second power supply terminal, and the internal circuit is operated according to current of a first dropped voltage or a second dropped voltage obtained in either the main voltage dropping circuit or the secondary voltage dropping circuit. Also, in cases where the semiconductor device is connected with a two-voltage supply type voltage source, electric power of a first input voltage is supplied from the two-voltage supply type voltage source to the main voltage dropping circuit through the first power supply terminal, electric power of a second input voltage is supplied from the two-voltage supply type voltage source to the secondary voltage dropping circuit through the second power supply terminal, and the internal circuit is operated according to electric power of a first dropped voltage or a second dropped voltage obtained in either the main voltage dropping circuit or the secondary voltage dropping circuit.

Accordingly, because the semiconductor device can be easily connected and operated with each of the one-voltage supply type voltage source and the two-voltage supply type voltage source without additionally arranging an electronic unit such as a switch, the semiconductor device can be conveniently used with each of various types of voltage sources, a power supply system composed of the voltage source and the semiconductor device can be simplified, and the semiconductor device can be manufactured at low cost.

It is preferred that the semiconductor device further comprises switching means, which is arranged in a wire extending from the first power supply terminal to the external voltage source, for electrically connecting or disconnecting the main voltage dropping circuit with/from the external voltage source through the first power supply terminal.

In the above configuration, in cases where the main voltage dropping circuit is disconnected from the external voltage source by the switching means, no electric powewr is supplied to the switching means.

Accordingly, the occurrence of leak current in the main voltage dropping circuit can be prevented, and electric power consumed in the semiconductor device can be reduced.

The main object and the subordinate object are achieved by the provision of a semiconductor device comprising a main voltage dropping circuit, arranged on a chip, for dropping a first input voltage to a first dropped voltage and outputting the first dropped voltage, a secondary voltage dropping circuit, arranged on the chip and having a current supplying capability and an electric power consumption rate smaller than those of the main voltage dropping circuit, for dropping the first input voltage or a second input voltage to a second dropped voltage and outputting the second dropped voltage, a first circuit unit of an internal circuit which is connected with the main voltage dropping circuit on the chip and is operated in cooperation with the main voltage dropping circuit, a second circuit unit of the internal circuit which is arranged on the chip and is operated in any time including a low electric power consumption time, first switching means, arranged on the chip, for selecting either a connection between the second circuit unit and the main voltage dropping circuit and a connection between the second circuit unit and the secondary voltage dropping circuit, a first power supply terminal which is arranged on the chip so as to allow connection with an external voltage source and is connected with the main voltage dropping circuit, and a second power supply terminal which is arranged on the chip so as to allow connection with the external voltage source and is connected with the secondary voltage dropping circuit.

In the above configuration, in a normal operation, a connection between the second circuit unit and the main voltage dropping circuit is selected by the first switching means, the first and second circuit units are operated according to electric power of the first dropped voltage obtained in the main voltage dropping circuit. Also, in a low electric power consumption operation, a connection between the second circuit unit and the secondary voltage dropping circuit is selected by the first switching means, the second circuit unit is operated according to electric power of the second dropped voltage obtained in the secondary voltage dropping circuit.

Accordingly, in the low electric power consumption operation, the occurrence of a leak current in the main voltage dropping circuit and the first circuit unit can be prevented when the outputting of current of the first input voltage output from the voltage source is stopped, and electric power consumed in the semiconductor device can be reduced.

It is preferred that the semiconductor device further comprises second switching means, which is arranged in a wire extending from the first power supply terminal to the external voltage source, for electrically connecting or disconnecting the main voltage dropping circuit with/from the external voltage source through the first power supply terminal, and a signal line through which a switching control signal is directly or indirectly sent to both the first switching means and the second switching means.

In the above configuration, a switching control signal indicating a normal operation or a low electric power consumption operation is simultaneously sent to both the first switching means and the second switching means through the signal line, and the selection operation of the first switching means and the connection/disconnection operation of the second switching means are simultaneously performed according to the switching control signal.

Accordingly, the change from a voltage supply form corresponding to the normal operation to a voltage supply form corresponding to the low electric power consumption operation can be reliably performed in a simplified configuration of the semiconductor device.

It is also preferred that the semiconductor device further comprises second switching means, which is arranged in a wire extending from the first power supply terminal to the external voltage source, for electrically connecting or disconnecting the main voltage dropping circuit with/from the external voltage source through the first power supply terminal, a signal line through which a switching control signal is sent to the second switching means, voltage comparing means for monitoring a voltage applied to the first power supply terminal, comparing the voltage and a prescribed threshold voltage and outputting a signal indicating a compared result, and control means, connected with the voltage comparing means, for controlling a selection operation performed by the first switching means according to the signal output from the voltage comparing means.

In the above configuration, when a switching control signal is sent to the second switching means, the connection/disconnection operation is performed in the second switching means, and the change of a voltage applied to the first power supply terminal is detected by the voltage comparing means. Thereafter, the compared result indicating the voltage change is received by the control means, and the selection operation of the first switching means is immediately performed under the control of the control means.

Accordingly, because the selection operation of the first switching means and the connection/disconnection operation of the second switching means can be almost simultaneously performed, the change from a voltage supply form corresponding to the normal operation to a voltage supply form corresponding to the low electric power consumption operation can be reliably performed in a simplified configuration of the semiconductor device.

Also, because the connection/disconnection operation of the second switching means can be monitored by the voltage comparing means, the reception of a control signal in the semiconductor device through a signal line is not required to perform the selection operation of the first switching means in synchronization with the connection/disconnection operation of the second switching means. Accordingly, the number of external terminals can be reduced in the semiconductor device.

Also, because the voltage input to the main voltage dropping circuit can be monitored, the occurrence of power supply fault in the voltage source connected with the semiconductor device can be immediately detected.

It is also preferred that the semiconductor device further comprises second switching means, which is arranged in a wire extending from the first power supply terminal to the external voltage source, for electrically connecting or disconnecting the main voltage dropping circuit with/from the external voltage source through the first power supply terminal, and voltage supply form determining means for determining a voltage supply form according to an operation state of the internal circuit and outputting a switching control signal directly or indirectly to both the first switching means and the second switching means to supply the first dropped voltage or the second dropped voltage corresponding to the voltage supply form to the internal circuit.

In the above configuration, when a voltage supply form is determined by the voltage supply form determining means according to an operation state of the internal circuit, a switching control signal indicating the voltage supply form to both the first switching means and the second switching means, and the selection operation of the first switching means and the connection/disconnection operation of the second switching means are simultaneously performed to supply the first dropped voltage or the second dropped voltage corresponding to the voltage supply form to the internal circuit.

Accordingly, because a voltage supply form appropriate to the internal circuit can be determined according to the operation state of the internal circuit, electric power consumed in the semiconductor device can be appropriately reduced. Also, because it is not required to produce a control signal in the outside of the semiconductor device, peripheral circuits of the semiconductor device can be simplified, and the semiconductor device can be manufactured at low cost.

DETAILED DESCRIPTION OF THE PREFERRED EMBODIMENTS

Embodiments of the present invention will now be described with reference to the accompanying drawings.

Embodiment 1

Figure 1:
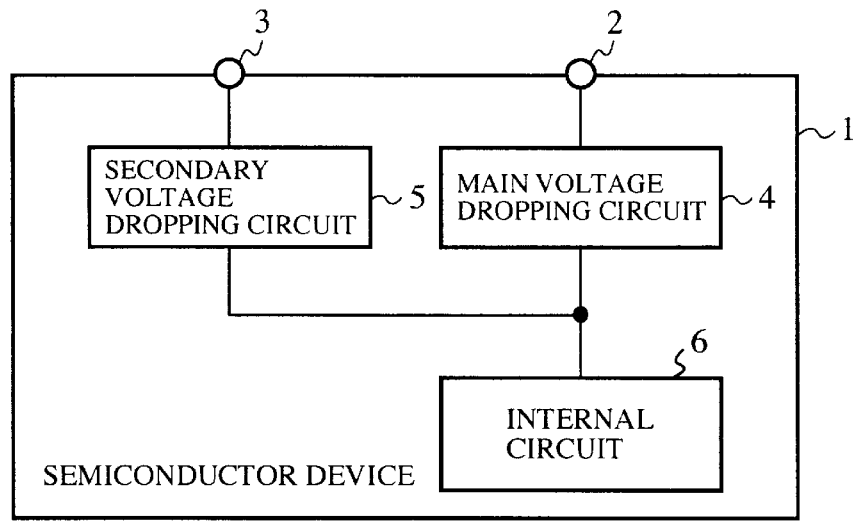
FIG. 1 is a block diagram showing the configuration of a semiconductor device according to first and second embodiments of the present invention.

FIG. 1 is a block diagram showing the configuration of a semiconductor device according to first and second embodiments of the present invention. In FIG. 1, referential numeral 1 indicates a chip of a semiconductor device for receiving electric power having a voltage from a voltage supply source and performing an operation by using the electric power. 2 indicates a first power supply terminal which is arranged in the semiconductor device 1 so as to allow connection with the voltage supply source of the outside. 3 indicates a second power supply terminal which is arranged in the semiconductor device 1 so as to allow connection with the voltage supply source of the outside. 4 indicates a main voltage dropping circuit, connected with the first power supply terminal 2, for dropping the voltage applied to the first power supply terminal 2 and outputting the dropped voltage. 5 indicates a secondary voltage dropping circuit, connected with the second power supply terminal 3, for dropping the voltage applied to the second power supply terminal 3 and outputting the dropped voltage. A current supplying capability and an electric power consumption rate in the secondary voltage dropping circuit 5 are smaller than those in the main voltage dropping circuit 4. 6 indicates an internal circuit for receiving electric power of a desired voltage from either the main voltage dropping circuit 4 or the secondary voltage dropping circuit 5 and performing a prescribed operation by using the electric power.

Figure 2A:
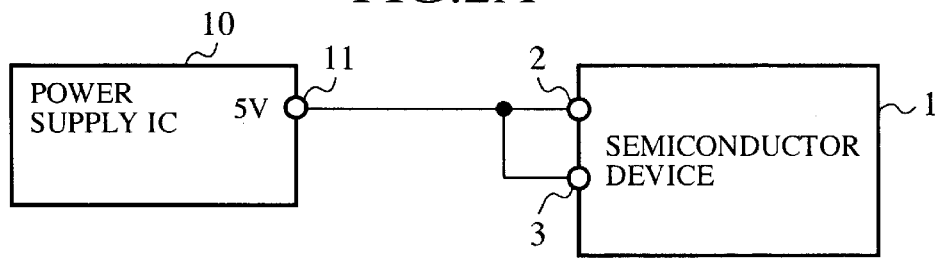
FIG. 2A is a block diagram showing the connection between the semiconductor device shown in FIG. 1 and a one-voltage supply type power supply IC of the outside according to the first embodiment of the present invention.
Figure 2B:
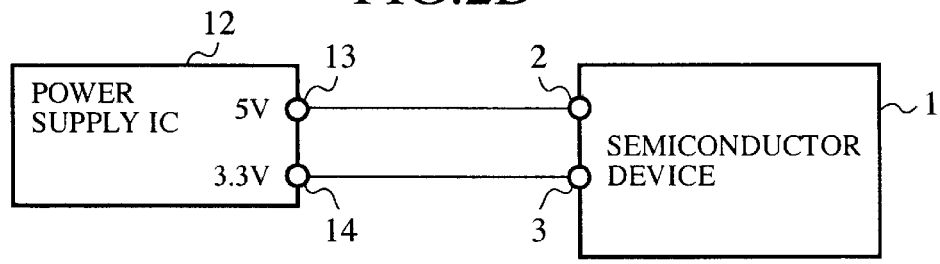
FIG. 2B is a block diagram showing the connection between the semiconductor device shown in FIG. 1 and a two-voltage supply type power supply IC of the outside according to the first embodiment of the present invention.

FIG. 2A is a block diagram showing the connection between the semiconductor device 1 shown in FIG. 1 and a one-voltage supply type power supply IC of the outside according to the first embodiment of the present invention. FIG. 2B is a block diagram showing the connection between the semiconductor device 1 shown in FIG. 1 and a two-voltage supply type power supply IC of the outside according to the first embodiment of the present invention. In FIG. 2A and FIG. 2B, the constitutional elements, which are equivalent to or the same as those shown in FIG. 1, are indicated by the same referential numerals as those shown in FIG. 1, and additional description of those constitutional elements is omitted. In FIG. 2, referential numeral 10 indicates a power supply IC (or an external voltage source) of one-voltage supply type. 11 indicates an output terminal of the power supply IC 10. 12 indicates a power supply IC (or another external voltage source) of two-voltage supply type. 13 indicates a high-voltage output terminal of the power supply IC 12 for supplying electric power of a high voltage of 5V from the power supply IC 12. 14 indicates a low-voltage output terminal of the power supply IC 12 for supplying electric power of a low voltage of 3.3V from the power supply IC 12.

Next, operations of the semiconductor device 1 will be described below.

As shown in FIG. 2A, in cases where the semiconductor device 1 is connected with the one-voltage supply type power supply IC 10, a wire extending from the output terminal 11 of the power supply IC 10 is divided into two wires, one divided wire is connected with the first power supply terminal 2 of the semiconductor device 1, and the other divided wire is connected with the second power supply terminal 3 of the semiconductor device 1. Therefore, a voltage output from the power supply IC 10 is applied to the main voltage dropping circuit 4 through the output terminal 11 and the first power supply terminal 2. Also, a voltage output from the power supply IC 10 is applied to the secondary voltage dropping circuit 5 through the output terminal 11 and the second power supply terminal 3.

In contrast, as shown in FIG. 2B, in cases where the semiconductor device 1 is connected with the two-voltage supply type power supply IC 12, the high-voltage output terminal 13 of the power supply IC 12 is connected with the first power supply terminal 2 of the semiconductor device 1, and the low-voltage output terminal 14 of the power supply IC 12 is connected with the second power supply terminal 3 of the semiconductor device 1. In this case, a high voltage of 5V output from the power supply IC 12 is applied to the main voltage dropping circuit 4 through the high-voltage output terminal 13 and the first power supply terminal 2, and a low voltage of 3.3V output from the power supply IC 12 is applied to the secondary voltage dropping circuit 5 through the low-voltage output terminal 14 and the second power supply terminal 3. Because the low voltage of 3.3V is applied to the secondary voltage dropping circuit 5, electric power consumed in the semiconductor device 1 is reduced.

As is described above, in the first embodiment, the first power supply terminal 2 connected with the main voltage dropping circuit 4 is arranged in the semiconductor device 1 so as to allow connection with the power supply IC 10 of the outside, and the second power supply terminal 3 connected with the secondary voltage dropping circuit 5 is arranged in the semiconductor device 1 so as to allow connection with the power supply IC 10 of the outside or the power supply IC 12 of the outside. Accordingly, because the semiconductor device 1 can be easily connected with each of the one-voltage supply type power supply IC 10 and the two-voltage supply type power supply IC 12 without additionally arranging an electronic unit such as a switch, the semiconductor device 1 can be conveniently used with each of various types of power supply ICs, a power supply system composed of the semiconductor device 1 and the power supply IC 10 or 12 can be simplified, and the semiconductor device 1 can be manufactured at low cost.

Also, the second power supply terminal 3 connects the secondary voltage dropping circuit 5, in which a current supplying capability and an electric power consumption rate are small, and the low-voltage output terminal 14 of the two-voltage supply type power supply IC 12. Therefore, electric power consumed in the semiconductor device 1 can be reduced.

Embodiment 2

Figure 3:
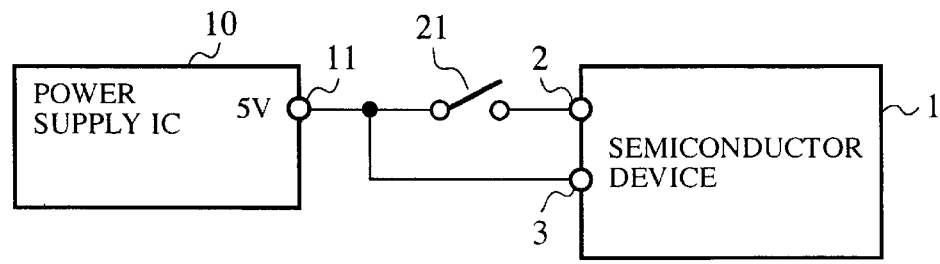
FIG. 3 is a block diagram showing the connection between the semiconductor device shown in FIG. 1 and a one-voltage supply type power supply IC of the outside according to a second embodiment of the present invention.

FIG. 3 is a block diagram showing the connection between the semiconductor device 1 shown in FIG. 1 and a one-voltage supply type power supply IC of the outside according to a second embodiment of the present invention. In FIG. 3, referential numeral 21 indicates a switch (or switching means) arranged in a wire which extends from the first power supply terminal 2 connected with the main voltage dropping circuit 4 to the outside. The output terminal 11 of the one-voltage supply type power supply IC 10 is electrically connected with or disconnected from the first power supply terminal 2 of the semiconductor device 1 by closing or opening the switch 21.

An operation of the semiconductor device 1 will be described below.

When the switch 21 is opened, the supply of electric power of the voltage from the power supply IC 10 to the main voltage dropping circuit 4 is stopped, and the occurrence of leak current in the main voltage dropping circuit 4 is prevented.

As is described above, in the second embodiment, the switch 21 is arranged in a wire extending from the first power supply terminal 2 to the outside to electrically connect or disconnect the main voltage dropping circuit 4 with/from the power supply IC 10. Accordingly, the occurrence of leak current in the main voltage dropping circuit 4 can be prevented, and electric power consumed in the semiconductor device 1 can be reduced.

In this embodiment, the switch 21 is arranged in a wire extending from the first power supply terminal 2 to the outside. However, it is applicable that the switch 21 be arranged in a wire extending from the second power supply terminal 3, which is connected with the secondary voltage dropping circuit 5, to the outside. Also, in addition to the switch 21, it is applicable that another switch be arranged in a wire extending from the second power supply terminal 4, which is connected with the secondary voltage dropping circuit 5, to the outside.

Embodiment 3

Figure 4:
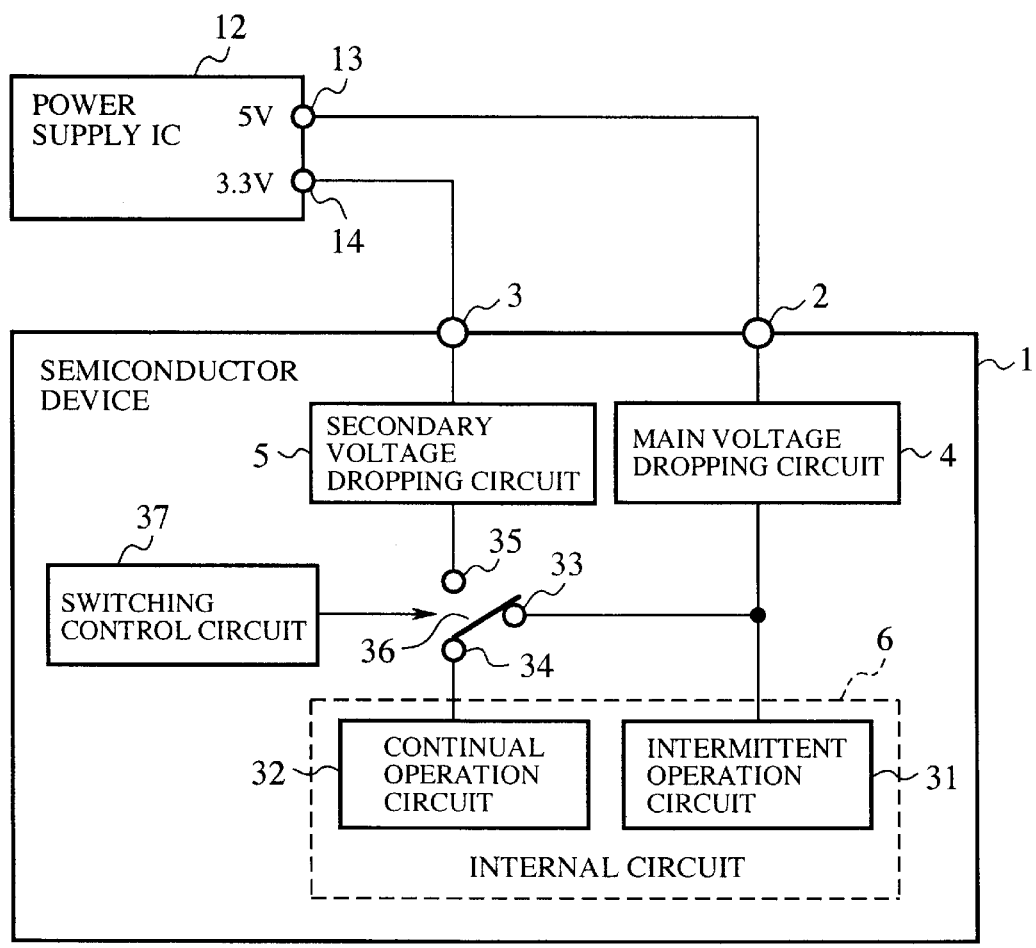
FIG. 4 is a block diagram showing both the configuration of a semiconductor device and the connection between the semiconductor device and the two-voltage supply type power supply IC of the outside according to a third embodiment of the present invention.

FIG. 4 is a block diagram showing both the configuration of a semiconductor device and the connection between the semiconductor device and the two-voltage supply type power supply IC 12 of the outside according to a third embodiment of the present invention. It is preferred that a third embodiment is applied for a semiconductor device in which parts of an internal circuit are always operated and the other parts of the internal circuit are intermittently operated to reduce electric power consumed in the semiconductor device. The constitutional elements, which are equivalent to or the same as those shown in FIG. 1 or FIG. 2, are indicated by the same referential numerals as those shown in FIG. 1 or FIG. 2, and additional description of those constitutional elements is omitted.

In FIG. 4, referential numeral 31 indicates an intermittent operation circuit (or a first circuit unit) of the internal circuit 6. The intermittent operation circuit 31 is connected with the main voltage dropping circuit 4 and is intermittently operated in cooperation with the main voltage dropping circuit 4. 32 indicates a continual operation circuit (or a second circuit unit) of the internal circuit 6. The continual operation circuit 32 is always operated even though a low electric power consumption operation is performed in the semiconductor device 1. 33 indicates a connection terminal arranged on an end of a wire which is connected with a wire connecting the intermittent operation circuit 31 and the main voltage dropping circuit 4. 34 indicates a connection terminal arranged on an end of a wire which is connected with the continual operation circuit 32. 35 indicates a connection terminal arranged on an end of a wire which is connected with the secondary voltage dropping circuit 5. 36 indicates a selector switch (or first switching means) for selecting the connection between the connection terminals 33 and 34 or the connection between the connection terminals 34 and 35. 37 indicates a switching control circuit for controlling the selection operation of the selector switch 36.

Next, an operation of the semiconductor device 1 will be described below.

When a normal operation is performed in the semiconductor device 1, the connection terminal 34 is connected with the connection terminal 33 by the selector switch 36 under the control of the switching control circuit 37. Thereafter, the voltage of 5V of electric power supplied from the power supply IC 12 is dropped in the main voltage dropping circuit 4, electric power of a voltage desired in the internal circuit 6 is supplied from the main voltage dropping circuit 4 to both the intermittent operation circuit 31 and the continual operation circuit 32, and the intermittent operation circuit 31 and the continual operation circuit 32 are operated by using the electric power.

Also, when a low electric power consumption operation is required of the semiconductor device 1, the continual operation circuit 32 is operated at a low electric power, 30 and the intermittent operation circuit 31 is not operated. More precisely, the connection terminal 34 is connected with the connection terminal 35 by the selector switch 36 under the control of the switching control circuit 37. Therefore, the voltage of 3.3V of electric power supplied from the power supply IC 12 is dropped in the secondary voltage dropping circuit 5, electric power of a voltage desired in the internal circuit 6 is supplied from the secondary voltage dropping circuit 5 to the continual operation circuit 32, and the continual operation circuit 32 is operated at a low electric power. In this case, electric power output from the high-voltage output terminal 13 of the power supply IC 12 is stopped, and no electric power is supplied from the power supply IC 12 to both the main voltage dropping circuit 4 and the intermittent operation circuit 31. Therefore, the occurrence of a leak current in the main voltage dropping circuit 4 and the intermittent operation circuit 31 is prevented.

In this embodiment, electric power output from the high-voltage output terminal 13 of the power supply IC 12 is stopped in the low electric power consumption operation. However, it is applicable that electric power supply to the main voltage dropping circuit 4 be interrupted by inputting a signal indicating the low electric power consumption rate to the main voltage dropping circuit 4.

As is described above, in the third embodiment, the connection between the continual operation circuit 32 and the main voltage dropping circuit 4 or the connection between the continual operation circuit 32 and the secondary voltage dropping circuit 5 is selected by the selector switch 36 under the control of the switching control circuit 37. Therefore, in the low electric power consumption operation, because the connection between the continual operation circuit 32 and the secondary voltage dropping circuit 5 is selected by the selector switch 36, the occurrence of a leak current in the main voltage dropping circuit 4 and the intermittent operation circuit 31 can be prevented when electric power output from the high-voltage output terminal 13 of the power supply IC 12 is stopped. Accordingly, greater reductions in electric power consumed in the semiconductor device 1 can be realized.

Embodiment 4

Figure 5:
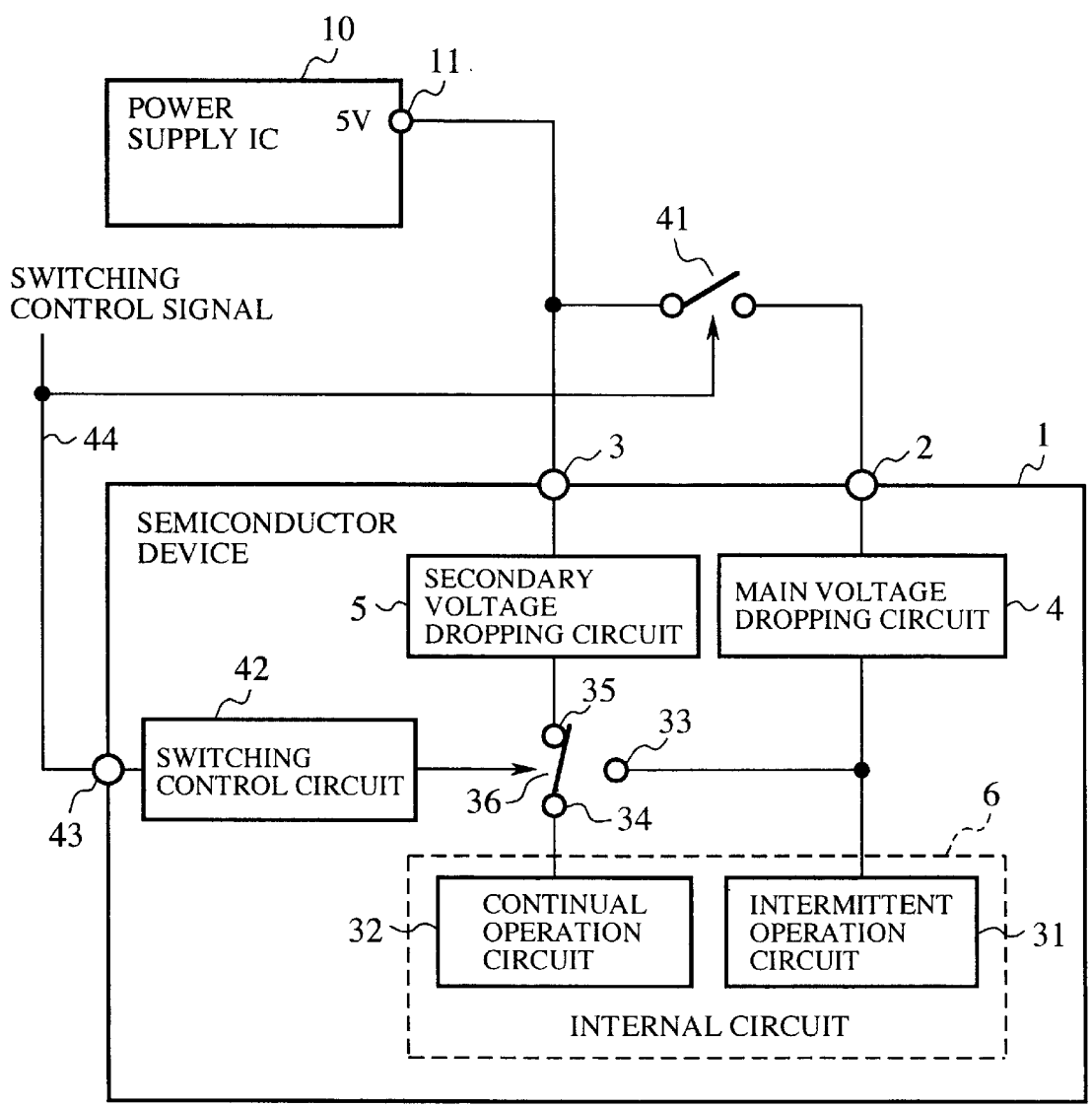
FIG. 5 is a block diagram showing both the configuration of a semiconductor device and the connection between the semiconductor device and the one-voltage supply type power supply IC of the outside according to a fourth embodiment of the present invention.

FIG. 5 is a block diagram showing both the configuration of a semiconductor device and the connection between the semiconductor device and the one-voltage supply type power supply IC 10 of the outside according to a fourth embodiment of the present invention. The constitutional elements, which are equivalent to or the same as those shown in FIG. 1, FIG. 2 or FIG. 4, are indicated by the same referential numerals as those shown in FIG. 1, FIG. 2 or FIG. 4, and additional description of those constitutional elements is omitted.

In FIG. 5, referential numeral 41 indicates a switch (or second switching means) arranged in a wire which extends from the first power supply terminal 2 connected with the main voltage dropping circuit 4 to the outside. The switch 41 is closed or opened according to a switching control signal to connect or disconnect the main voltage dropping circuit 4 with/from the power supply IC 10. 42 indicates a switching control circuit for controlling the selection operation of the selector switch 36 according to the switching control signal. 43 indicates a connection terminal through which the switching control signal sent from the outside is received in the switching control circuit 42 of the semiconductor device 1. 44 indicates a signal line connected with the switch 41 and the connection terminal 43 to send the switching control signal to the switch 41 and the connection terminal 43 through the signal line.

Next, an operation of the semiconductor device 1 will be described below.

When a normal operation is performed in the semiconductor device 1, a switching control signal indicating a normal operation is sent from the outside to the switch 41 and the switching control circuit 42 through the signal line 44, the switch 41 is closed according to the switching control signal to connect the main voltage dropping circuit 4 with the power supply IC 10, and the connection terminal 34 is connected with the connection terminal 33 by the selector switch 36 under the control of the switching control circuit 42. Therefore, electric power set to the voltage of 5V is supplied from the power supply IC 12 to the main voltage dropping circuit 4 through the switch 41, electric power, of which a voltage is dropped in the main voltage dropping circuit 4, is supplied to both the intermittent operation circuit 31 and the continual operation circuit 32, and the intermittent operation circuit 31 and the continual operation circuit 32 are operated.

Also, when a low electric power consumption operation is required of the semiconductor device 1, a switching control signal indicating a low electric power consumption operation is sent from the outside to the switch 41 and the switching control circuit 42 through the signal line 44, the switch 41 is opened according to the switching control signal to disconnect the main voltage dropping circuit 4 from the power supply IC 10, and the connection terminal 34 is connected with the connection terminal 35 by the selector switch 36 under the control of the switching control circuit 42. Therefore, the voltage of 5V of the electric power supplied from the power supply IC 12 is dropped in the secondary voltage dropping circuit 5, electric power of a dropped voltage is supplied from the secondary voltage dropping circuit 5 to only the continual operation circuit 32, and the continual operation circuit 32 is operated. Therefore, because no electric power is supplied to the main voltage dropping circuit 4, the occurrence of a leak current in the main voltage dropping circuit 4 and the intermittent operation circuit 31 is prevented.

As is described above, in the fourth embodiment, the effect obtained in the third embodiment can be obtained. Also, the switch 41 is arranged to select the connection or disconnection of the main voltage dropping circuit 4 with/from the power supply IC 10, and the signal line 44 is arranged to send the switching control signal to both the switch 41 and the switching control circuit 42. Therefore, the selection operation of the selector switch 36 and the open-close operation of the switch 41 can be simultaneously performed. Accordingly, the change from a voltage supply form corresponding to the normal operation to a voltage supply form corresponding to the low electric power consumption operation can be reliably performed in a simplified configuration of the semiconductor device 1.

Embodiment 5

Figure 6:
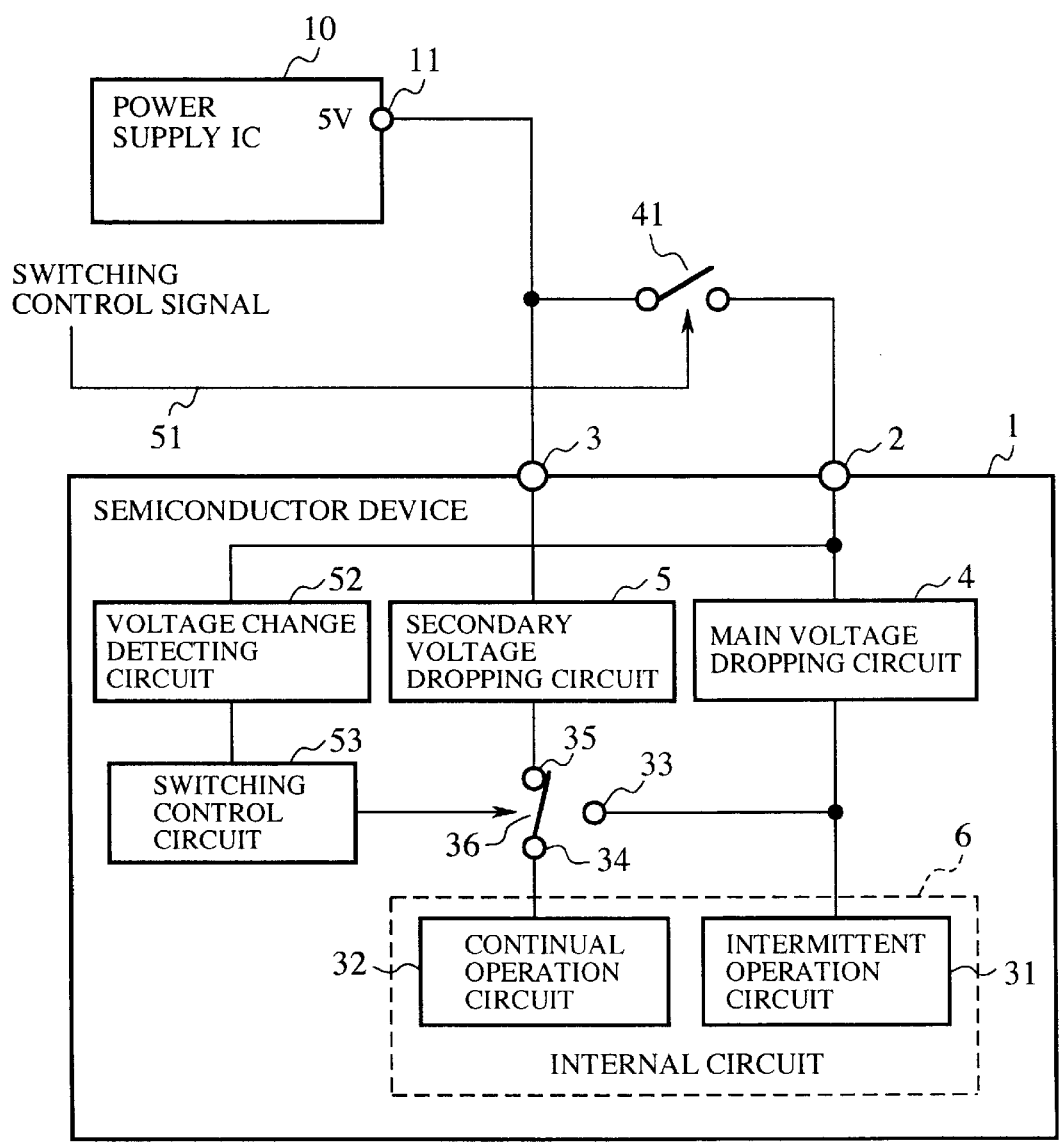
FIG. 6 is a block diagram showing both the configuration of a semiconductor device and the connection between the semiconductor device and the one-voltage supply type power supply IC of the outside according to a fifth embodiment of the present invention.

FIG. 6 is a block diagram showing both the configuration of a semiconductor device and the connection between the semiconductor device and the one-voltage supply type power supply IC 10 of the outside according to a fifth embodiment of the present invention. The constitutional elements, which are equivalent to or the same as those shown in FIG. 5, are indicated by the same referential numerals as those shown in FIG. 5, and additional description of those constitutional elements is omitted.

In FIG. 6, referential numeral 51 indicates a signal line through which a switching control signal is sent from the outside. 52 indicates a voltage change detecting circuit (or voltage comparing means) for monitoring a voltage applied to the first power supply terminal 2 as an input voltage applied to the main voltage dropping circuit 4 and outputting a signal indicating a voltage drop (or a voltage-up) in cases where the monitored voltage is dropped (or increased) to a value lower (or higher) than a prescribed threshold value. 53 indicates a switching control circuit (or control means), connected with the voltage change detecting circuit 52, for controlling the selection operation of the selector switch 36 according to the signal of the voltage change detecting circuit 52.

Next, an operation of the semiconductor device 1 will be described below.

When a normal operation is performed in the semiconductor device 1, a switching control signal is sent to the switch 41 through the signal line 51, and the switch 41 is closed according to the switching control signal to connect the main voltage dropping circuit 4 with the power supply IC 10. Therefore, the voltage of 5V is applied to the first power supply terminal 2 through the switch 41. Because the voltage applied to the first power supply terminal 2 is higher than the prescribed threshold value, a signal indicating voltage-up is output from the voltage change detecting circuit 52 to the switching control circuit 53, and the connection terminal 34 is connected with the connection terminal 33 by the selector switch 36 under the control of the switching control circuit 53. Therefore, electric power, of which a voltage is dropped in the main voltage dropping circuit 4, is supplied from the main voltage dropping circuit 4 to both the intermittent operation circuit 31 and the continual operation circuit 32, and the intermittent operation circuit 31 and the continual operation circuit 32 are operated by using the electric power.

Also, when a low electric power consumption operation is required of the semiconductor device 1, a switching control signal indicating a low electric power consumption operation is sent to the switch 41 through the signal line 51, the switch 41 is opened according to the switching control signal to disconnect the main voltage dropping circuit 4 from the power supply IC 10. Because the voltage applied to the first power supply terminal 2 is dropped to a value lower than the prescribed threshold value, a signal indicating voltage drop is output from the voltage change detecting circuit 52 to the switching control circuit 53, and the connection terminal 34 is connected with the connection terminal 35 by the selector switch 36 under the control of the switching control circuit 53. Therefore, electric power, of which a voltage is dropped in the secondary voltage dropping circuit 5, is supplied to only the continual operation circuit 32, and the continual operation circuit 32 is operated by using the electric power. Therefore, because no electric power is supplied to the main voltage dropping circuit 4 through the switch 41, the occurrence of a leak current in the main voltage dropping circuit 4 and the intermittent operation circuit 31 is prevented.

As is described above, in the fifth embodiment, the effect obtained in the third embodiment can be obtained. Also, the switch 41 is arranged to select the connection or disconnection of the main voltage dropping circuit 4 with/from the power supply IC 10, the signal line 51 is arranged to send the switching control signal to the switch 41, the voltage change detecting circuit 52 is arranged to detect the voltage change at the first power supply terminal 2 and to output a signal indicating the voltage drop or voltage-up, and the switching control circuit 53 is arranged to control the selector switch 36 according to the signal of the voltage change detecting circuit 52. Therefore, because the selector switch 36 is controlled in response to the voltage change depending on the open-close of the switch 41, the selection operation of the selector switch 36 and the open-close operation of the switch 41 can be almost simultaneously performed. Accordingly, the change from a voltage supply form corresponding to the normal operation to a voltage supply form corresponding to the low electric power consumption operation can be reliably performed in a simplified configuration of the semiconductor device 1.

Also, because the open-close operation of the switch 41 can be monitored in the voltage change detecting circuit 52 of the semiconductor device 1, the reception of the switching control signal in the semiconductor device 1 through a signal line is not required to perform the selection operation of the selector switch 36 in synchronization with the open-close operation of the switch 41. Accordingly, the number of external terminals can be reduced in the semiconductor device 1.

Also, because the voltage applied to the main voltage dropping circuit 4 can be monitored, the occurrence of power supply fault in the power supply IC 10 connected with the semiconductor device 1 can be immediately detected.

Embodiment 6

Figure 7:
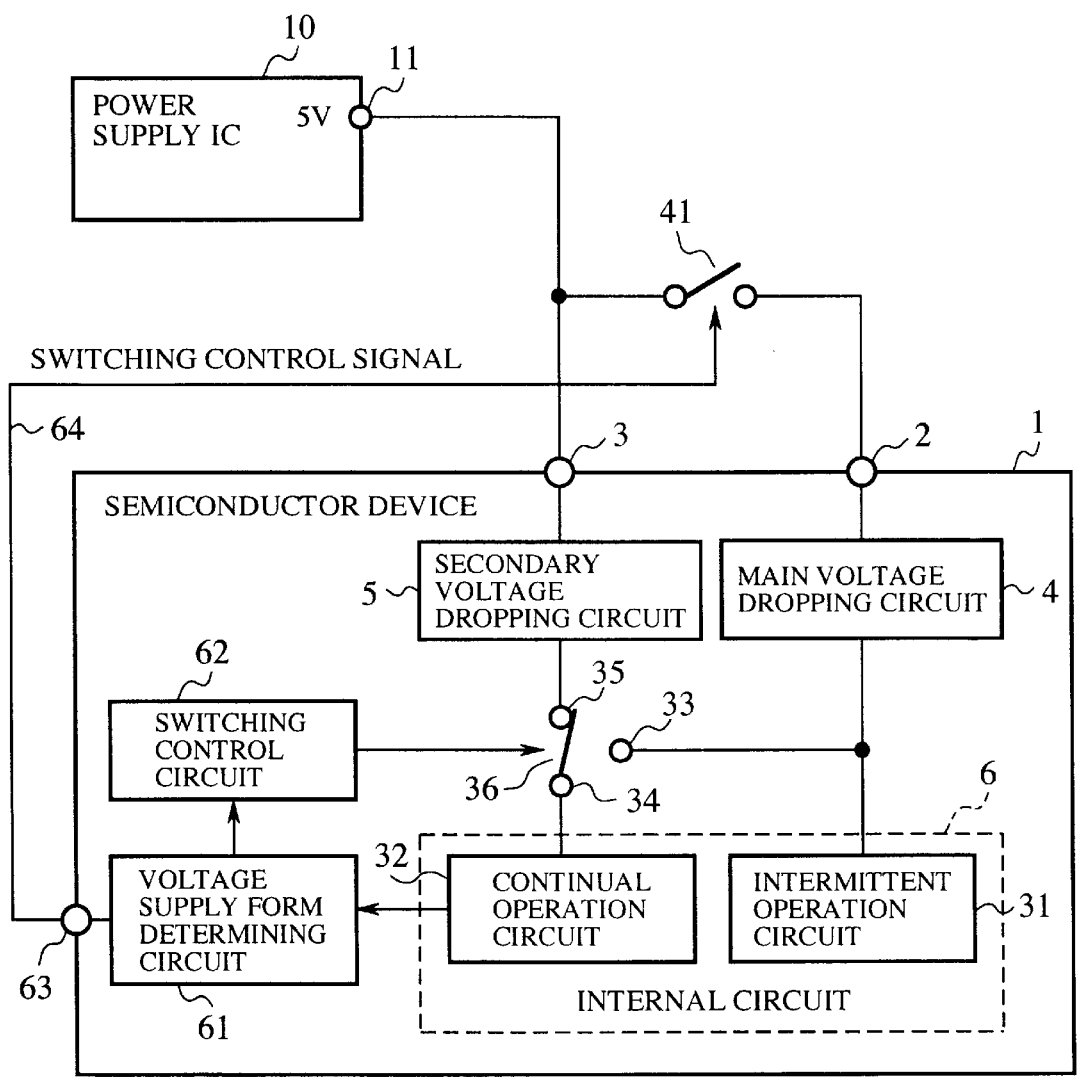
FIG. 7 is a block diagram showing both the configuration of a semiconductor device and the connection between the semiconductor device and the one-voltage supply type power supply IC of the outside according to a sixth embodiment of the present invention.
Figure 8:
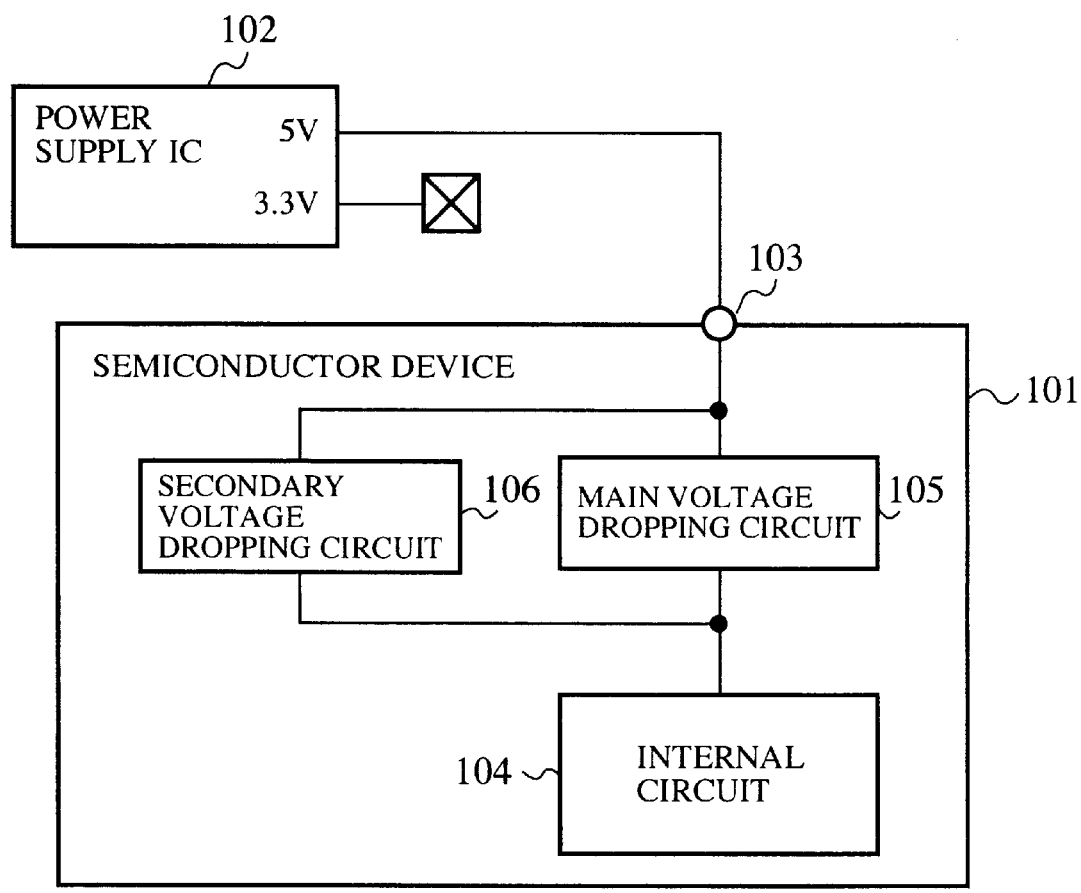
FIG. 8 is a block diagram showing the configuration of a conventional power supply system.

FIG. 7 is a block diagram showing both the configuration of a semiconductor device and the connection between the semiconductor device and the one-voltage supply type power supply IC 10 of the outside according to a sixth embodiment of the present invention. The constitutional elements, which are equivalent to or the same as those shown in FIG. 5, are indicated by the same referential numerals as those shown in FIG. 5, and additional description of those constitutional elements is omitted.

In FIG. 7, referential numeral 61 indicates a voltage supply form determining circuit (or voltage supply form determining means) for receiving a signal indicating an operation state (for example, a normal operation state of a low electric power consumption operation state) of the internal circuit 6 from the continual operation circuit 32 and determining a voltage supply form appropriate to the internal circuit 6 according to the signal. 62 indicates a switching control circuit for receiving a signal indicating the appropriate voltage supply form from the voltage supply form determining circuit 61 and controlling a selection operation of the selector switch 36 according to the signal. 63 indicates a connection terminal through which a switching control signal of the voltage supply form determining circuit 61 is output to the outside. 64 indicates a signal line which extends from the connection terminal 63 and is connected with the switch 41 to send the switching control signal from the voltage supply form determining circuit 61 to the switch 41 through the connection terminal 63.

Next, an operation of the semiconductor device 1 will be described below.

In the voltage supply form determining circuit 61, a signal indicating an operation state of the internal circuit 6 is received from the continual operation circuit 32, and a voltage supply form appropriate to the internal circuit 6 is determined. In cases where the operation state of the internal circuit 6 corresponds to a normal operation, a voltage supply form corresponding to the normal operation is determined in the voltage supply form determining circuit 61. Therefore, a switching control signal indicating the normal operation is sent from the voltage supply form determining circuit 61 to the switching control circuit 62 and the switch 41, the switch 41 is closed to connect the main voltage dropping circuit 4 with the power supply IC 10, the connection terminal 34 is connected with the connection terminal 33 by the selector switch 36 under the control of the switching control circuit 62, electric power, of which a voltage is dropped in the main voltage dropping circuit 4, is supplied to both the intermittent operation circuit 31 and the continual operation circuit 32, and the intermittent operation circuit 31 and the continual operation circuit 32 are operated by using the electric power.

In contrast, in cases where the operation state of the internal circuit 6 corresponds to a low electric power consumption operation, a voltage supply form corresponding to the low electric power consumption operation is determined in the voltage supply form determining circuit 61. Therefore, a switching control signal indicating the low electric power consumption operation is sent from the voltage supply form determining circuit 61 to the switching control circuit 62 and the switch 41, the switch 41 is opened to disconnect the main voltage dropping circuit 4 from the power supply IC 10, the connection terminal 34 is connected with the connection terminal 35 by the selector switch 36 under the control of the switching control circuit 62, electric power, of which a voltage is dropped in the secondary voltage dropping circuit 5, is supplied to only the continual operation circuit 32, and the continual operation circuit 32 is operated by using the electric power. Therefore, because no electric power is supplied to the main voltage dropping circuit 4 through the switch 41, the occurrence of a leak current in the main voltage dropping circuit 4 and the intermittent operation circuit 31 is prevented.

As is described above, in the sixth embodiment, the effect obtained in the third embodiment can be obtained. Also, the switch 41 is arranged to select the connection or disconnection of the main voltage dropping circuit 4 with/from the power supply IC 10, the voltage supply form determining circuit 61 is arranged to determine a voltage supply form appropriate to the internal circuit 6 according to the operation state of the internal circuit 6, the switching control circuit 62 is arranged to control the selection operation of the selector switch 36 according to the voltage supply form determined in the voltage supply form determining circuit 61, and the signal line 64 is arranged to send the switching control signal from the voltage supply form determining circuit 61 to the switch 41. Accordingly, because a voltage supply form appropriate to the internal circuit 6 can be determined according to the operation state of the internal circuit 6, electric power consumed in the semiconductor device 1 can be appropriately reduced. Also, because it is not required to produce a control signal in the outside of the semiconductor device 1, peripheral circuits of the semiconductor device 1 can be simplified, and the semiconductor device 1 can be manufactured at low cost.

In the sixth embodiment, to determine a voltage supply form appropriate to the internal circuit 6 according to the operation state of the internal circuit 6, a voltage supply form determining means is realized in hardware by arranging the voltage supply form determining circuit 61 in the semiconductor device 1. However, it is applicable that the voltage supply form determining means be realized in software by performing data processing based on a program which is stored in a memory arranged in the semiconductor device 1.

What is claimed is:

1. A semiconductor device comprising:

an internal circuit which is arranged on a chip and is operated at any of a first dropped voltage and a second dropped voltage;

a main voltage dropping circuit, arranged on the chip, for dropping a first input voltage to the first dropped voltage and outputting the first dropped voltage to the internal circuit;

a secondary voltage dropping circuit, arranged on the chip and having a current supplying capability and an electric power consumption rate smaller than those of the main voltage dropping circuit, for dropping the first input voltage or second input voltage to the second dropped voltage and outputting the second dropped voltage to the internal circuit;

a first power supply terminal which is arranged on the chip so as to allow connection with a first external voltage source having the first input voltage and is connected with the main voltage dropping circuit; and a second power supply terminal which is arranged on the chip so as to allow connection with either the first external voltage source or a second external voltage source having the second input voltage and is connected with the secondary voltage dropping circuit.

2. A semiconductor device according to claim 1, further comprising switching means, which is arranged in a wire extending from the first power supply terminal to the first external voltage source, for electrically connecting or disconnecting the main voltage dropping circuit with/from the first external voltage source through the first power supply terminal.

3. A semiconductor device comprising:

a main voltage dropping circuit, arranged on a chip, for dropping a first input voltage to a first dropped voltage and outputting the first dropped voltage;

a secondary voltage dropping circuit, arranged on the chip and having a current supplying capability and an electric power consumption rate smaller than those of the main voltage dropping circuit, for dropping the first input voltage or a second input voltage to a second dropped voltage and outputting the second dropped voltage;

a first circuit unit of an internal circuit which is connected with the main voltage dropping circuit on the chip and is operated in cooperation with the main voltage dropping circuit;

a second circuit unit of the internal circuit which is arranged on the chip and is operated in any time including a low electric power consumption time;

first switching means, arranged on the chip, for selecting either a connection between the second circuit unit and the main voltage dropping circuit and a connection between the second circuit unit and the secondary voltage dropping circuit;

a first power supply terminal which is arranged on the chip so as to allow connection with an external voltage source and is connected with the main voltage dropping circuit; and a second power supply terminal which is arranged on the chip so as to allow connection with the external voltage source and is connected with the secondary voltage dropping circuit.

4. A semiconductor device according to claim 3, further comprising second switching means, which is arranged in a wire extending from the first power supply terminal to the external voltage source, for electrically connecting or disconnecting the main voltage dropping circuit with/from the external voltage source through the first power supply terminal; and a signal line through which a switching control signal is directly or indirectly sent to both the first switching means and the second switching means.

5. A semiconductor device according to claim 3, further comprising:

second switching means, which is arranged in a wire extending from the first power supply terminal to the external voltage source, for electrically connecting or disconnecting the main voltage dropping circuit with/from the external voltage source through the first power supply terminal;

a signal line through which a switching control signal is sent to the second switching means;

voltage comparing means for monitoring a voltage applied to the first power supply terminal, comparing the voltage and a prescribed threshold voltage and outputting a signal indicating a compared result; and control means, connected with the voltage comparing means, for controlling a selection operation performed by the first switching means according to the signal output from the voltage comparing means.

6. A semiconductor device according to claim 3, further comprising:

second switching means, which is arranged in a wire extending from the first power supply terminal to the external voltage source, for electrically connecting or disconnecting the main voltage dropping circuit with/from the external voltage source through the first power supply terminal; and voltage supply form determining means for determining a voltage supply form according to an operation state of the internal circuit and outputting a switching control signal directly or indirectly to both the first switching means and the second switching means to supply the first dropped voltage or the second dropped voltage corresponding to the voltage supply form to the internal circuit.

* * * * *